(12) United States Patent
Ahn et al.

(10) Patent No.: US 9,099,242 B2
(45) Date of Patent: Aug. 4, 2015

(54) LAMINATED CHIP ELECTRONIC COMPONENT, BOARD FOR MOUNTING THE SAME, AND PACKING UNIT THEREOF

(75) Inventors: Young Ghyu Ahn, Gyunggi-do (KR); Sang Soo Park, Gyunggi-do (KR); Min Cheol Park, Gyunggi-do (KR); Se Hwa Jeong, Gyunggi-do (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/588,696

(22) Filed: Aug. 17, 2012

(65) Prior Publication Data

US 2013/0319741 A1   Dec. 5, 2013

(30) Foreign Application Priority Data

May 30, 2012 (KR) .......................... 10-2012-0057723
Aug. 16, 2012 (KR) .......................... 10-2012-0089522

(51) Int. Cl.
| | |
|---|---|
| *H05K 1/16* | (2006.01) |
| *H01G 4/005* | (2006.01) |
| *H05K 1/02* | (2006.01) |
| *H01G 4/30* | (2006.01) |

(52) U.S. Cl.
CPC ................. *H01G 4/005* (2013.01); *H01G 4/30* (2013.01); *H05K 1/0271* (2013.01)

(58) Field of Classification Search
USPC .................. 174/255–258, 260–262; 361/272, 361/301.4, 748, 780, 793
See application file for complete search history.

(56) References Cited

U.S. PATENT DOCUMENTS

| | | |
|---|---|---|
| 5,989,726 A | 11/1999 | Noji et al. |
| 6,780,267 B1 | 8/2004 | Kuramitsu et al. |
| 2005/0167243 A1 | 8/2005 | Yagi |
| 2006/0158827 A1 | 7/2006 | Lee et al. |
| 2008/0118721 A1 | 5/2008 | Horie et al. |
| 2009/0067117 A1 | 3/2009 | Kasuya et al. |
| 2011/0051314 A1 | 3/2011 | Sakurai et al. |
| 2011/0114378 A1* | 5/2011 | Yoshii et al. .................. 174/260 |
| 2012/0152604 A1* | 6/2012 | Ahn et al. ..................... 174/260 |

(Continued)

FOREIGN PATENT DOCUMENTS

| | | |
|---|---|---|
| CN | 1171257 C | 10/2004 |
| EP | 0866478 A2 | 9/1998 |

(Continued)

OTHER PUBLICATIONS

Extended European Search Report issued in EP Patent Application No. 12275125.8 dated Mar. 4, 2013.

(Continued)

*Primary Examiner* — Tremesha S Willis
(74) *Attorney, Agent, or Firm* — McDermott Will & Emery LLP

(57) ABSTRACT

A laminated chip electronic component includes: a ceramic body including internal electrodes and dielectric layers; external electrodes formed to cover both end portions of the ceramic body in a length direction; an active layer in which the internal electrodes are disposed in an opposing manner, while having the dielectric layers interposed therebetween, to form capacitance; and upper and lower cover layers formed on upper and lower portions of the active layer in a thickness direction, the lower cover layer having a thickness greater than that of the upper cover layer.

17 Claims, 10 Drawing Sheets

(56) References Cited

U.S. PATENT DOCUMENTS

| | | |
|---|---|---|
| 2012/0241205 A1* | 9/2012 | Shimizu .................. 174/260 |
| 2012/0297608 A1 | 11/2012 | Miyazaki |
| 2012/0300361 A1 | 11/2012 | Togashi |
| 2013/0038979 A1 | 2/2013 | Togashi |

FOREIGN PATENT DOCUMENTS

| | | |
|---|---|---|
| EP | 1598872 A1 | 11/2005 |
| EP | 1715494 A1 | 10/2006 |
| JP | 63-052770 U | 4/1988 |
| JP | 6-215978 A | 8/1994 |
| JP | 06-215978 A | 8/1994 |
| JP | 6-268464 A | 9/1994 |
| JP | 07-329915 A | 12/1995 |
| JP | 8-130160 A | 5/1996 |
| JP | 11-340106 A | 12/1999 |
| JP | 2000-243657 A | 9/2000 |
| JP | 2003-282332 A | 10/2003 |
| JP | 2004-193352 A | 7/2004 |
| JP | 2004-259991 A | 9/2004 |
| JP | 2005-217136 A | 8/2005 |
| JP | 2007-142342 A | 6/2007 |
| JP | 2009-071106 A | 4/2009 |
| TW | 201110166 A1 | 3/2011 |
| TW | 201128666 A1 | 8/2011 |
| WO | 2007/007677 A1 | 1/2007 |
| WO | 2007105865 A1 | 9/2007 |

OTHER PUBLICATIONS

Japanese Office Action, w/ English translation thereof, issued in Japanese Patent Application No. JP 2013-123532 dated Jan. 7, 2014.
Examination Report issued Taiwanese Patent Application No. 101132128, dated Dec. 12, 2013.
Decision of Rejection dated Oct. 28, 2014 issued in corresponding Japanese Patent Application No. 2013-123532 (English translation).
European Examination Report dated Dec. 12, 2014 issued in corresponding European Patent Application No. 12275125.8.
Extended Search Report dated Dec. 23, 2014 issued in corresponding European Patent Application No. 14174616.4.
Korean Office Action issued in Korean Application No. 10-2012-0126533 dated Sep. 30, 2014, wlEnglish translation.
Japanese Notice of Office Action issued in corresponding Japanese Patent Application No. 2014-087129 on Jan. 20, 2015; 5 pages with English translation.

* cited by examiner

LAMINATED CHIP ELECTRONIC COMPONENT, BOARD FOR MOUNTING THE SAME, AND PACKING UNIT THEREOF

CROSS-REFERENCE TO RELATED APPLICATIONS

This application claims the priority of Korean Patent Application Nos. 10-2012-0057723 filed on May 30, 2012, and 10-2012-0089522 filed on Aug. 16, 2012 in the Korean Intellectual Property Office, the disclosure of which is incorporated herein by reference.

BACKGROUND OF THE INVENTION

1. Field of the Invention

The present invention relates to a laminated chip electronic component for reducing acoustic noise generated by the laminated chip electronic component, a board for mounting the same, and a packing unit thereof.

2. Description of the Related Art

A multilayer capacitor, a laminated chip electronic component, includes internal electrodes formed between a plurality of dielectric layers.

When DC or AC voltages are applied to the multilayer capacitor having internal electrodes overlapping with dielectric layers interposed therebetween, a piezoelectric effect takes place between the internal electrodes, generating vibrations.

As permittivity of a dielectric layer becomes higher and the size of a chip is larger based on the same capacitance, generated vibrations become more intense. The generated vibrations are transferred from external electrodes of the multilayer capacitor to a printed circuit board (PCB) on which the multilayer capacitor is mounted. Here, the PCB vibrates to produce a noise.

When the noise produced due to the vibrations of the PCB is included in an audio frequency, a corresponding vibrating sound may make users uncomfortable, and such a sound is known as acoustic noise.

In order to reduce acoustic noise, the inventors of the present invention has conducted research on a mounting direction of internal electrodes within a multilayer capacitor, in relation to a PCB. As a result of the research, it has been recognized that mounting a multilayer capacitor on a PCB to have directionality such that internal electrodes of the multilayer capacitor are horizontal with the PCB, may reduce acoustic noise in comparison to a case in which a multilayer capacitor is mounted on the PCB such that internal electrodes thereof are perpendicular to the PCB.

However, even in the case that the multilayer capacitor is mounted on the PCB such that internal electrodes thereof are horizontal with the PCB, acoustic noise may be measured and determined to still be at a certain level or higher, so a further reduction in acoustic noise remains an issue to be studied.

PRIOR ART DOCUMENTS (Patent document 1) Japanese Patent Laid Open Publication No. 1994-268464
(Patent document 2) Japanese Patent Laid Open Publication No. 1994-215978
(Patent document 3) Japanese Patent Laid Open Publication No. 1996-130160

Patent document 1 discloses internal electrodes mounted to have horizontal directionality in relation to a PCB, but it has technical characteristics in which a pitch between signal lines is narrowed to reduce high frequency noise. Meanwhile, Patent document 2 and Patent document 3 disclose different thickness of an upper cover layer and a lower cover layer in a multilayer capacitor. However, the documents do not suggest any motive or solution for reducing the acoustic noise. Moreover, the documents absolutely do not disclose or anticipate an extent of how much the central portion of the active layer is deviated from the central portion of the laminated chip capacitor, a ratio of the upper cover layer to the lower cover layer, a ratio of the lower cover layer to the thickness of the ceramic body, and a ratio of the lower cover layer to the thickness of the active layer, etc.

SUMMARY OF THE INVENTION

An aspect of the present invention provides a multilayer capacitor as a laminated chip capacitor in which a lower cover layer is thicker than an upper cover layer, and a central portion of an active layer is set to be within a range deviating from a central portion of a ceramic body.

Another aspect of the present invention provides a board for mounting a laminated chip electronic component, on which a laminated chip electronic component is mounted such that internal electrodes thereof are horizontal to a printed circuit board (PCB) and a lower cover layer is adjacent to the PCB, thus reducing acoustic noise.

Another aspect of the present invention provides a packing unit of a laminated chip electronic component, in which internal electrodes of a laminated chip electronic component are horizontally disposed and aligned based on a lower surface of a receiving portion of a packing sheet.

According to an aspect of the present invention, there is provided a laminated chip electronic component including: a ceramic body including internal electrodes and dielectric layers; external electrodes formed to cover both end portions of the ceramic body in a length direction; an active layer in which the internal electrodes are disposed in an opposing manner, while having the dielectric layers interposed therebetween, to form capacitance; and upper and lower cover layers formed on upper and lower portions of the active layer in a thickness direction, the lower cover layer having a thickness greater than that of the upper cover layer, wherein when half of a thickness of the ceramic body is defined as A, a thickness of the lower cover layer is defined as B, half of a thickness of the active layer is defined as C, and a thickness of the upper cover layer is defined as D, the thickness (D) of the upper cover layer satisfies a range of $D \geq 4$ μm and a ratio $(B+C)/A$ by which a central portion of the active layer deviates from a central portion of the ceramic body satisfies a range of $1.063 \leq (B+C)/A \leq 1.745$.

A ratio (D/B) of the thickness (D) of the upper cover layer to the thickness (B) of the lower cover layer may satisfy $0.021 \leq D/B \leq 0.422$.

A ratio (B/A) of the thickness (B) of the lover cover layer to the half (A) of the thickness of the ceramic body may satisfy $0.329 \leq B/A \leq 1.522$ A ratio (C/B) of the half (C) of the thickness of the active layer to the thickness (B) of the lower cover layer may satisfy $0.14 \leq C/B \leq 2.458$.

A mark for differentiating upper and lower portions may be formed on at least one of upper and lower surfaces of the ceramic body.

According to another aspect of the present invention, there is provided a laminated chip electronic component including: external electrodes formed on both end portions of a ceramic body having a hexahedral shape in a length direction; an active layer formed within the ceramic body and including a plurality of internal electrodes disposed to face each other, while having dielectric layers interposed therebetween to form capacitance; an upper cover layer formed on an upper portion of the uppermost internal electrode of the active layer; and a lower cover layer formed on a lower portion of the lowermost internal electrode of the active layer and having a thickness greater than that of the upper cover layer, wherein due to a difference between strain generated in a central portion of the active layer and that generated in the lower cover layer as a voltage is applied, a point of inflection (PI) is formed at both end portions of the ceramic body in the length direction, which are lower than the central portion of the ceramic body in the thickness direction, and when half of a thickness of the ceramic body is defined as A, a thickness of the lower cover layer is defined as B, and half of a thickness of the active layer is defined as C, a ratio (B+C)/A by which a central portion of the active layer deviates from a central portion of the ceramic body satisfies a range of $1.063 \leq (B+C)/A \leq 1.745$ When a thickness of the upper cover layer is defined as D, the ratio α ratio (D/B) of the thickness (D) of the upper cover layer to the thickness (B) of the lower cover layer may satisfy $0.021 \leq D/B \leq 0.422$.

A ratio (B/A) of the thickness (B) of the lover cover layer to the half (A) of the thickness of the ceramic body satisfies $0.329 \leq B/A \leq 1.522$.

A ratio (C/B) of the half (C) of the thickness of the active layer to the thickness (B) of the lower cover layer satisfies $0.146 \leq C/B \leq 2.458$.

According to another aspect of the present invention, there is provided a board for mounting a laminated chip electronic component, including: a laminated chip electronic component according to an embodiment of the present invention; electrode pads electrically connected to the external electrodes through soldering; and a printed circuit board (PCB) on which the electrode pads are formed and the laminated chip electronic component is mounted on the electrode pads such that the internal electrodes are horizontal and the lower cover layer is disposed at a lower side than the upper cover layer in a thickness direction.

Due to a difference between strain generated in a central portion of the active layer and that generated in the lower cover layer as a voltage is applied, a point of inflection (PI) formed at both end portions of the ceramic body in a length direction may be formed to be lower than the height of the soldering.

According to another aspect of the present invention, there is provided a packing unit including: a laminated chip electronic component according to an embodiment of the present invention; a packing sheet including a receiving portion for receiving the laminated chip electronic component; and a packing film coupled to the packing sheet and covering the laminated chip electronic component, wherein the internal electrodes are disposed to be aligned horizontally based on a lower surface of the receiving portion.

The packing sheet in which the laminated chip electronic component is received may be wound as a reel type.

At least one of the upper cover layer and the lower cover layer may be received to have directionality of opposing the lower surface of the receiving portion, and a mark may be formed on the ceramic body in order to allow the directionality of the upper cover layer and the lower cover layer, to be recognized from the outside.

Each of the laminated chip electronic components received in the receiving portions may be disposed such that the lower cover layer thereof faces the lower surface of the receiving portion.

A mark for differentiating upper and lower portions may be formed on an upper surface of the ceramic body.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
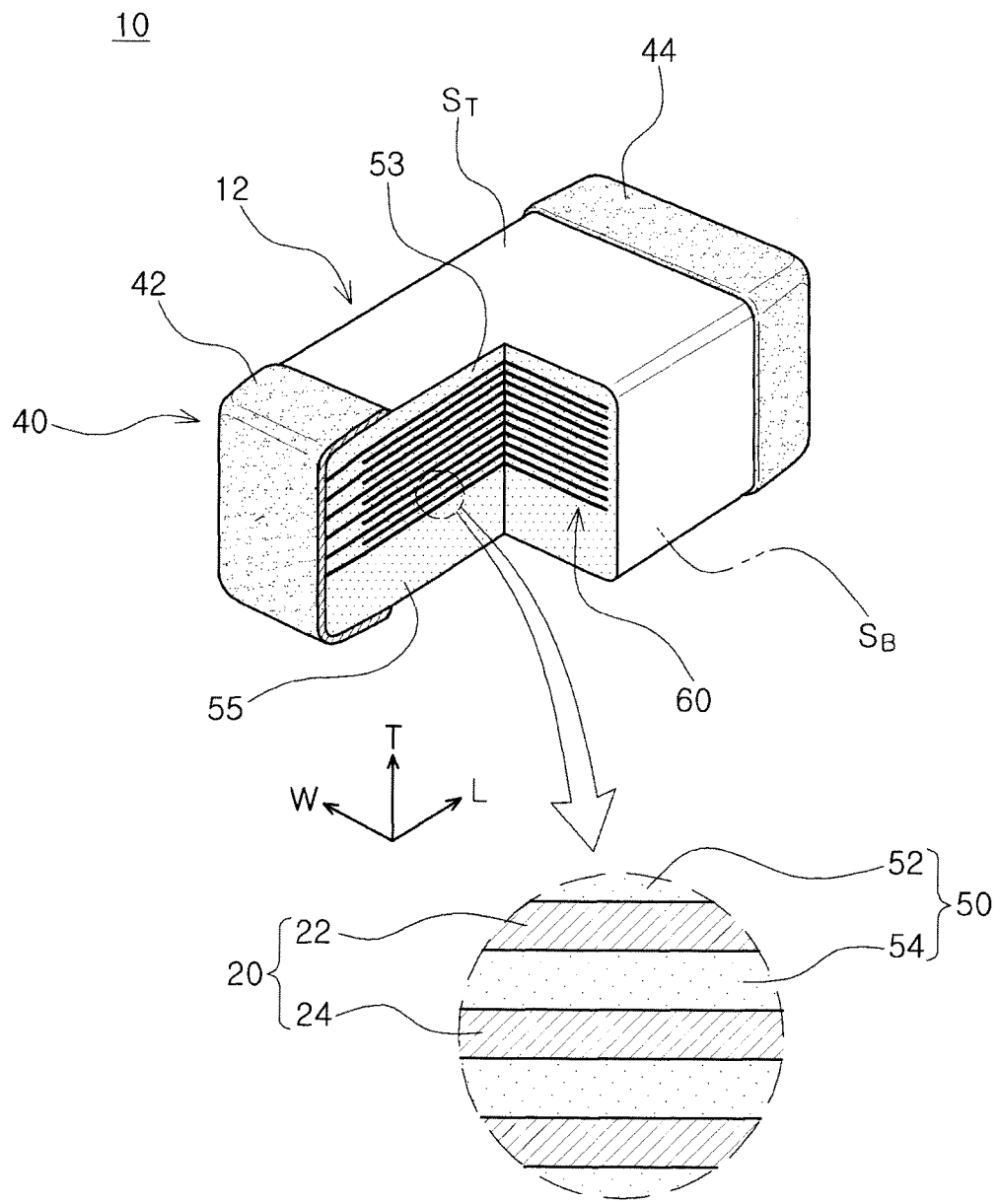
FIG. 1 is a schematic cutaway perspective view of a laminated chip capacitor according to an embodiment of the present invention.

Embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like components.

A laminated chip electronic component according to an embodiment of the present invention may be able to be used in a multilayer ceramic capacitor, a laminated varistor, a thermistor, a piezoelectric element, a multilayer substrate, and the like, which uses dielectric layers and has a structure in which internal electrodes face with the dielectric layer interposed therebetween.

Also, elements having the same function within a scope of the same concept illustrated in drawings of respective embodiments will be described by using the same reference numerals.

Laminated Chip Capacitor

Figure 2:
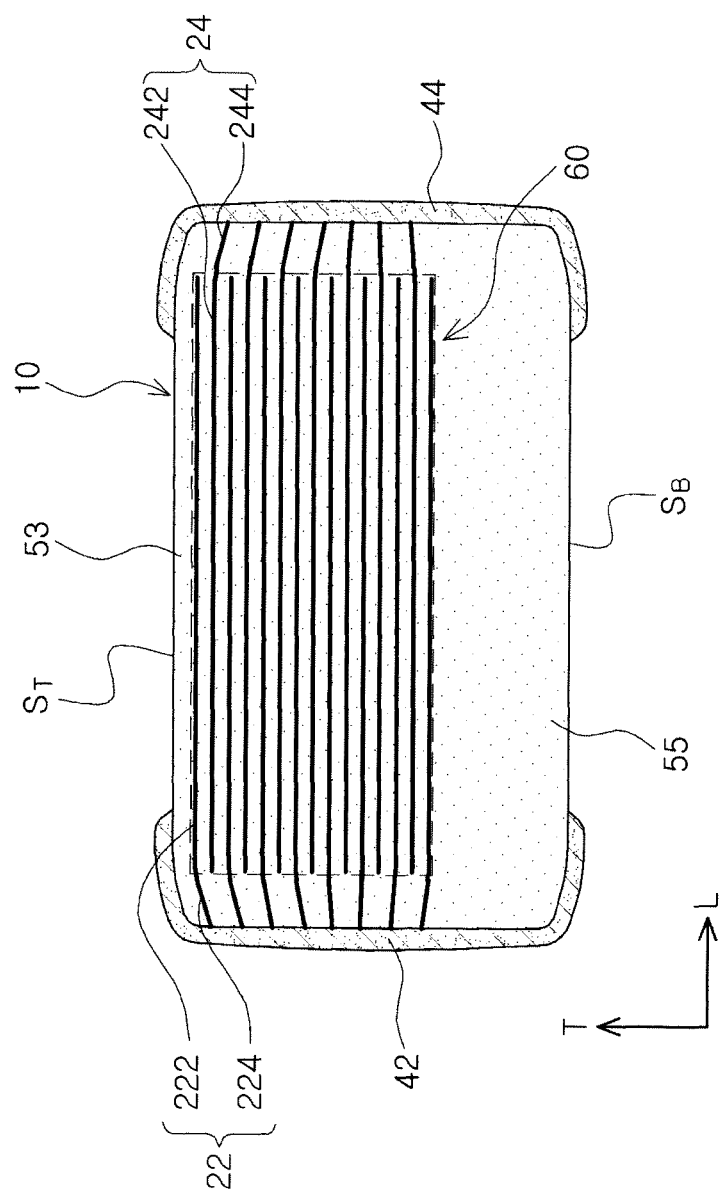
FIG. 2 is a cross-sectional view of the laminated chip capacitor of FIG. 1 taken in length and thickness directions.
Figure 3:
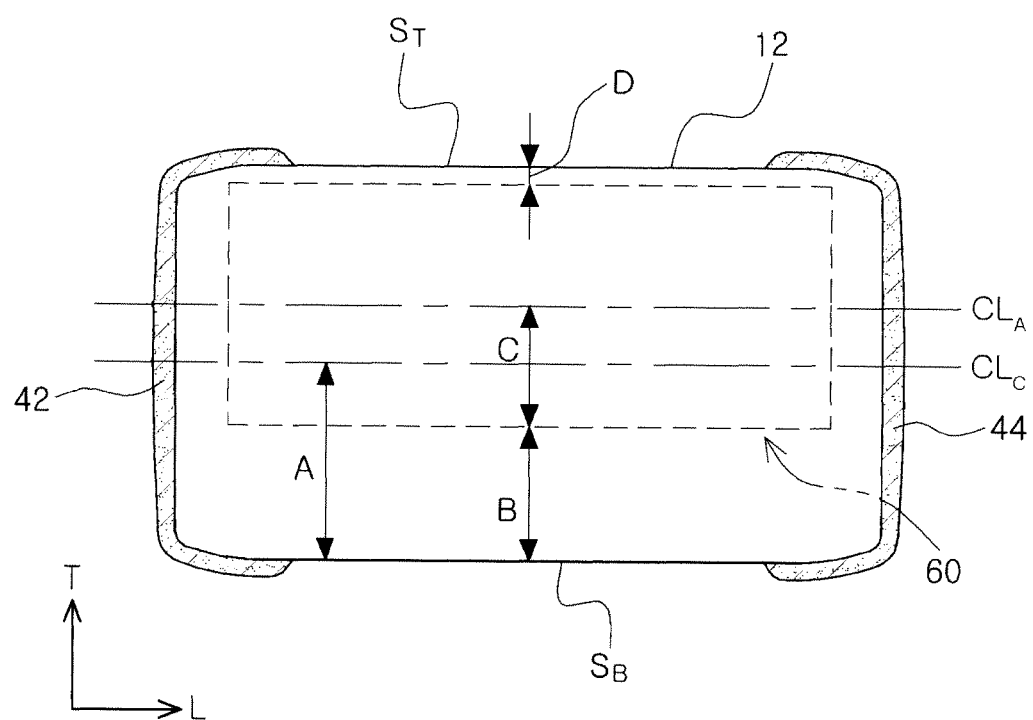
FIG. 3 is a schematic cross-sectional view of the laminated chip capacitor of FIG. 1 taken in the length and thickness directions showing dimensions.

FIG. 1 is a schematic cutaway perspective view of a laminated chip capacitor according to an embodiment of the present invention. FIG. 2 is a cross-sectional view of the laminated chip capacitor of FIG. 1 taken in length and thickness directions. FIG. 3 is a schematic cross-sectional view of the laminated chip capacitor of FIG. 1 taken in the length and thickness directions showing dimensions.

With reference to FIGS. 1 through 3, a laminated chip capacitor 10 may include a ceramic body 12, an external electrode 40, an active layer 60, and upper and lower cover layers 53 and 55.

The ceramic body 12 may be fabricated by applying a conductive paste to a ceramic green sheet to form an internal electrode 20, laminating the ceramic green sheets each having the internal electrode 20 formed thereon, and firing the same. The ceramic body 12 may be formed by repeatedly laminating a plurality of dielectric layers 52 and 54 and internal electrodes 22 and 24.

The ceramic body 12 may have a hexahedral shape. When the chip is fired, ceramic powder is shrunken, so the ceramic body 12 may not have a hexahedral shape with entirely straight lines, yet it may have substantially hexahedral shape.

In order to clarify embodiments of the present invention, directions of the hexahedron may be defined as follows: L, W, and T indicated in FIG. 1 denote a length direction, a width direction, and a thickness direction, respectively. Here, the thickness direction may be used to have the same concept as that of a lamination direction in which the dielectric layers are laminated.

The embodiment of FIG. 1 is a laminated chip capacitor 10 having a rectangular parallelepiped shape in which a length thereof is greater than width and thickness thereof.

Ceramic powder having high K-dielectrics (or high dielectric constant) may be used as a material of the dielectric layer 50 in order to obtain high capacitance. As the ceramic powder, for example, barium titanate ($BaTiO_3$)-based powder, strontium titanate ($SrTiO_3$)-based powder, or the like, may be used but the present invention is not limited thereto.

The first and second external electrodes 42 and 44 may be formed with a conductive paste including metal powder. As metal used for a metal powder included in the conductive paste, copper (Cu), nickel (Ni), or an alloy thereof may be used, but the present invention is not particularly limited thereto.

The internal electrodes 20 may include a first internal electrode 22 and a second internal electrode 24, and the first and second internal electrodes 22 and 24 may be electrically connected to the first and second external electrodes 42 and 44, respectively.

Here, the first internal electrode 22 and the second internal electrode 24 may include first and second electrode pattern portions 222 and 242 which overlap in an opposing manner with the dielectric layer 54 (Please See FIG. 1) interposed therebetween and first and second lead portions 224 and 244 led out to the first and second external electrodes 42 and 44, respectively.

The first and second electrode pattern portions 222 and 242 may be successively laminated in the thickness direction to constitute the active layer 60 forming capacitance within the ceramic body 12.

In view of the section of the laminated chip capacitor in the length direction and thickness direction, portions other than the active layer 60 may be defined as margin portions. Among the margin portions, upper and lower margin portions of the active layer 60 in the thickness direction may particularly be defined as the upper cover layer 53 and the lower cover layer 55.

Like the dielectric layers 52 and 54 formed between the first internal electrode 22 and the second internal electrode 24, the upper cover layer 53 and the lower cover layer 55 may be formed as ceramic green sheets are sintered.

The plurality of dielectric layers 50 including the upper cover layer 53 and the lower cover layer 55 are in a sintered state and adjacent dielectric layers 50 may be integrated such that boundaries therebetween may not be readily apparent without the use of a scanning electron microscope (SEM).

In the present embodiment, the lower cover layer 55 may have a thickness greater than that of the upper cover layer 53. Namely, by increasing the lamination number of ceramic green sheets in comparison to the upper cover layer 53, the lower cover layer 55 may have a thickness greater than that of upper cover layer 53.

Thus, with the structure in which the upper cover layer 53 and the lower cover layer 55 are formed to be asymmetrical, if an electrode is not formed in the lower cover layer 55, a delamination or crack defects may increase due to a difference in shrinkage rates between the active layer 60 and the lower cover layer 55 when they are sintered to be shrunken.

Thus, an internal electrode layer may be added to the lower cover layer 55 to reduce the difference in shrinkage rates between the active layer 60 and the lower cover layer 55 to obtain the effect of reducing acoustic noise as well as reducing delamination or crack generation.

With reference to FIG. 3, the laminated chip capacitor according the present embodiment may be more clearly defined.

First, it may be defined such that half of the overall thickness of the ceramic body 12 is A, a thickness of the lower cover layer 55 is B, half of the overall thickness of the active layer 60 is C, and a thickness of the upper cover layer 53 is D.

The overall thickness of the ceramic body 12 does not include a thickness of the external electrodes 40 coated on an upper surface $S_T$ and a lower surface $S_B$ of the ceramic body 12. In the present embodiment, half of a distance (thickness) from the upper surface $S_T$ to the lower surface $S_B$ of the ceramic body 12 is defined as A.

The thickness B of the lower cover layer 55 is defined as a distance from a lower surface of the lowermost internal electrode of the active layer 60 in the thickness direction to the lower surface $S_B$ of the ceramic body 12. The thickness D of the upper cover layer 53 is defined as a distance from an upper surface of the uppermost internal electrode of the active layer 60 in the thickness direction to the upper surface $S_T$ of the ceramic body 12.

Here, the overall thickness of the active layer 60 refers to a distance from an upper surface of the uppermost internal electrode of the active layer 60 to a lower surface of the lowermost internal electrode of the active layer 60. C is defined as half of the active layer 60.

In the present embodiment, the thickness of the upper cover layer 53 may satisfy a range of $D \geq 4$ μm. When D is smaller than 4 μm, the internal electrode may be exposed from the upper surface $S_T$ of the ceramic body 12, resulting in a defective product.

Also, in the present embodiment, a ratio $(B+C)/A$ by which the central portion of the active layer 60 deviates from a central portion of the ceramic body 12 may satisfy a range of $1.063 \leq (B+C)/A \leq 1.745$.

Here, the central portion of the active layer may be defined as within 1 μm up and down from a center line $CL_A$, a central point between the upper surface of the uppermost internal electrode of the active layer 60 and the lower surface of the lowermost internal electrode of the active layer 60.

Also, the central portion of the ceramic body 12 may be defined as within 1 μm up and down from a center line CLc of the ceramic body as a central point between the upper surface $S_T$ and the lower surface $S_B$ of the ceramic body 12.

When voltages having different polarities are applied to the first and second external electrodes 42 and formed on both end portions of the laminated chip capacitor 10, the ceramic body 12 expands and contracts in the thickness direction due to an inverse piezoelectric effect of the dielectric layers 50, while the both end portions of the first and second external electrodes 42 and 44 in the thickness direction contract and expand due to a Poisson effect, contrary to the expansion and contraction of the ceramic body 12 in the thickness direction.

Here, the central portion of the active layer 60 is a portion maximally expanded and contracted in both end portions of the first and second external electrodes 42 and 44 in the length direction, causing acoustic noise.

In the present embodiment, in order to reduce acoustic noise, the central portion of the active layer 60 is defined as being outside of the central portion of the ceramic body 12.

Meanwhile, in the present embodiment, due to a difference between strain generated in the central portion of the active layer 60 and that generated in the lower cover layer 55 as a voltage is applied, a point of inflection may be formed at both end portions of the ceramic body 12 in the length direction, which are lower than the central portion of the ceramic body 12 in the thickness direction.

In order to reduce acoustic noise, in the present embodiment, the ratio (D/B) of the thickness (D) of the upper cover layer to the thickness (B) of the lower cover layer may satisfy $0.021 \leq D/B \leq 0.422$.

Also, the ratio (B/A) of the thickness (B) of the lover cover layer to the half (A) of the thickness of the ceramic body may satisfy $0.329 \leq B/A \leq 1.522$.

The ratio (C/B) of the half (C) of the thickness of the active layer to the thickness (B) of the lower cover layer may satisfy $0.14 \leq C/B \leq 2.458$.

Meanwhile, in order to mount the lower cover layer 55 having a thickness greater than that of the upper cover layer 53 such that it is adjacent to an upper surface of a printed circuit board (PCB), a mark for differentiating upper and lower portions may be formed on at least one of the upper and lower surfaces of the ceramic body 12.

Board for Mounting Laminated Chip Capacitor

Figure 4:
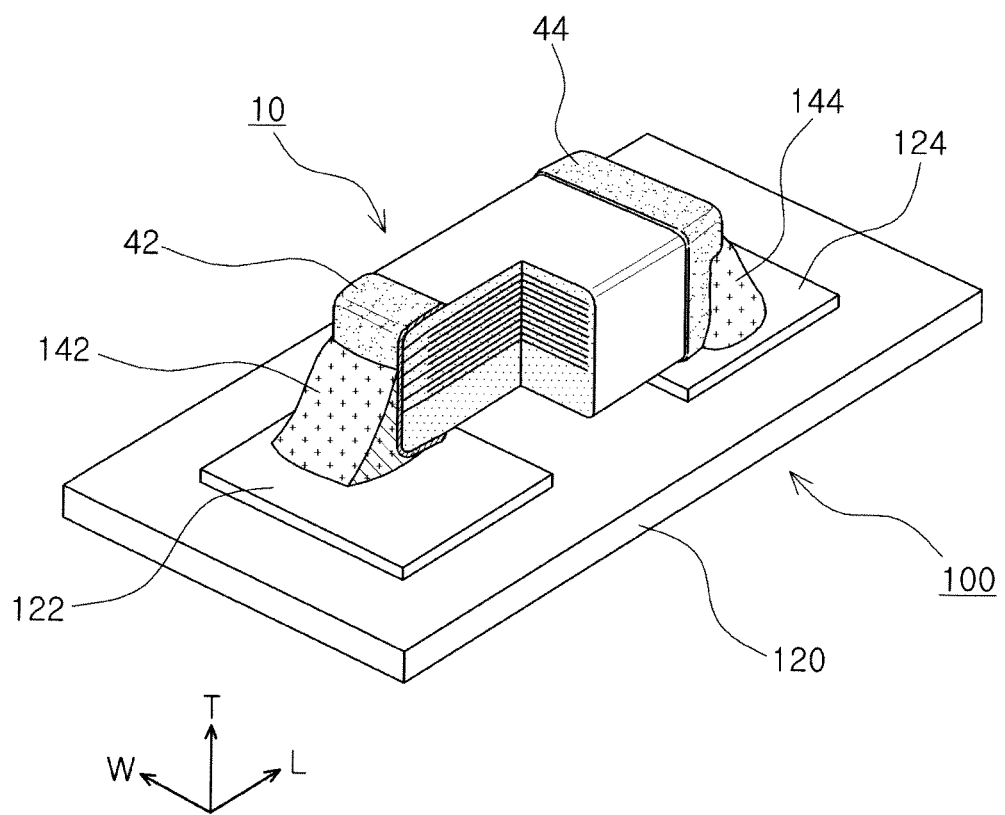
FIG. 4 is a schematic perspective view of the laminated chip capacitor of FIG. 1 mounted on a printed circuit board (PCB)
Figure 5:
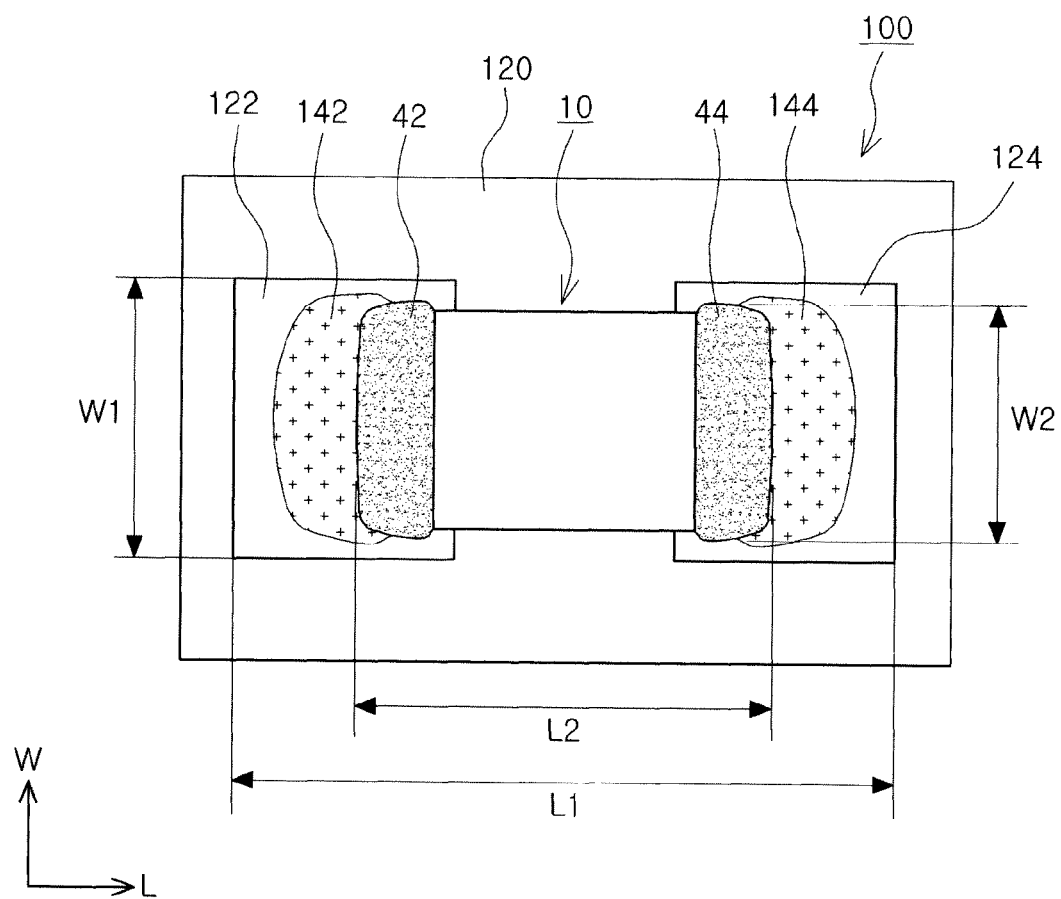
FIG. 5 is a schematic plan view of the laminated chip capacitor of FIG. 4 mounted on the PCB.
Figure 6:
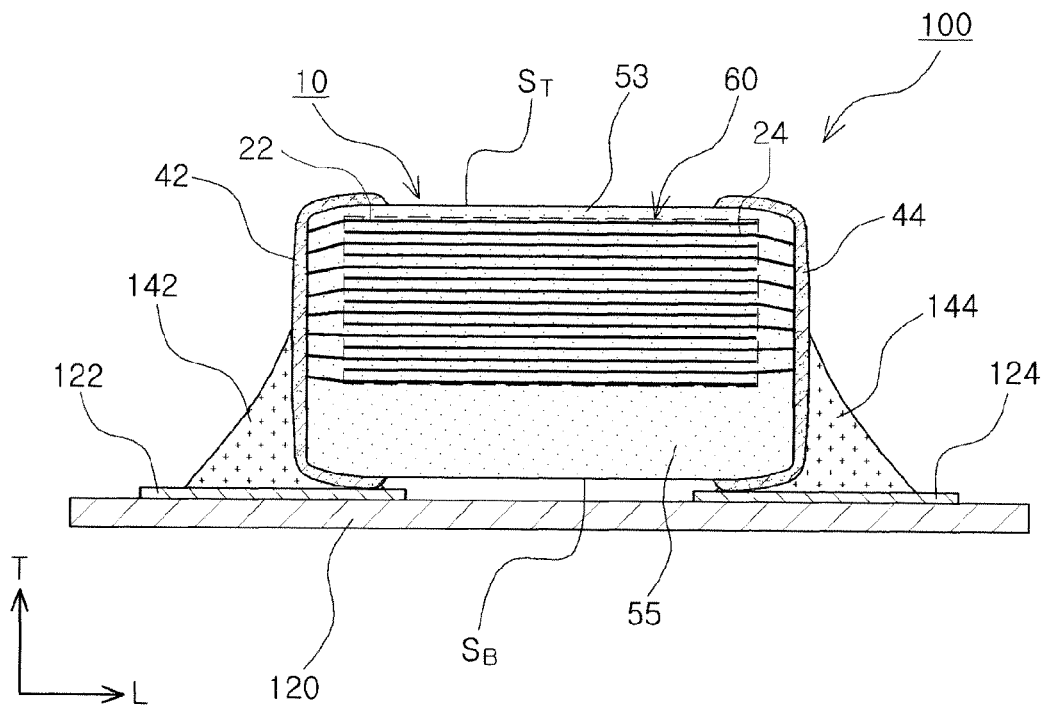
FIG. 6 is a cross-sectional view of the laminated chip capacitor of FIG. 4 mounted on the PCB taken in the length and thickness directions.

FIG. 4 is a schematic perspective view of the laminated chip capacitor of FIG. 1 mounted on a printed circuit board (PCB). FIG. 5 is a schematic plan view of the laminated chip capacitor of FIG. 4 mounted on the PCB. FIG. 6 is a cross-sectional view of the laminated chip capacitor of FIG. 4 mounted on the PCB taken in the length and thickness directions.

A board 100 for mounting a laminated chip capacitor thereon according to an embodiment of the present invention may include the laminated chip electronic component 10, electrode pads 122 and 124, and a printed circuit board 120.

The laminated chip electronic component 10 may be the laminated chip capacitor as described above, and the laminated chip capacitor 10 may be mounted on the PCB such that the internal electrodes 22 and 24 are horizontal to the PCB 120.

Also, the laminated chip capacitor 10 may be mounted on the PCB 120 such that the lower cover layer 55 thicker than the upper cover layer 53 within the ceramic body 12 of the laminated chip capacitor 10 is disposed in a lower side than the upper cover layer 53 in the thickness direction.

When a voltage is applied to the laminated chip capacitor 10 mounted on the PCB 120, acoustic noise is generated. Here, a size of the electrode pads 122 and 124 may determine an amount of solders 142 and 144 connecting the first and second external electrodes 42 and 44 and the electrode pads 122 and 124, respectively, and reduce acoustic noise.

Figure 7:
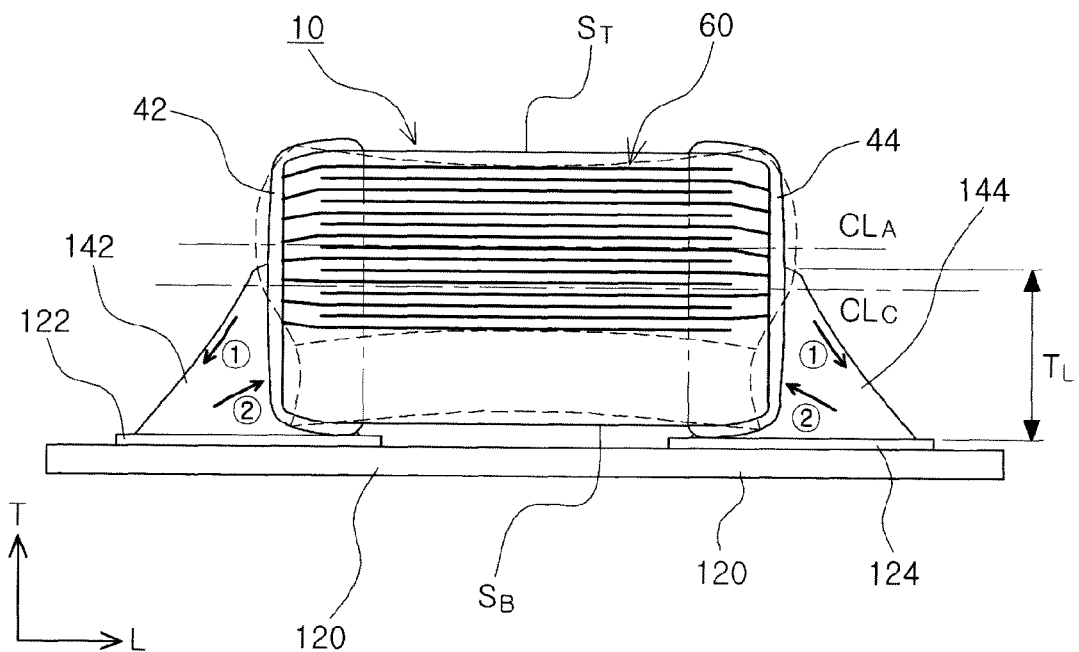
FIG. 7 is a schematic cross-sectional view showing the laminated chip capacitor of FIG. 4 mounted on the PCB which is deformed as a voltage is applied thereto.

FIG. 7 is a schematic cross-sectional view showing the laminated chip capacitor of FIG. 4 mounted on the PCB which is deformed as a voltage is applied thereto.

With reference to FIG. 7, with the laminated chip capacitor 10 mounted on the PCB 120, when voltages having different polarities are applied to the first and second external electrodes 42 and 44 formed on both end portions of the laminated chip capacitor 10, the ceramic body 12 expands and contracts in the thickness direction due to inverse piezoelectric effect of the dielectric layers 50, while the both end portions of the first and second external electrodes 42 and 44 in the length direction contract and expand due to a Poisson effect, contrary to the expansion and contraction of the ceramic body 12 in the thickness direction.

Meanwhile, in the present embodiment, due to a difference between strain generated in the central portion of the active layer 60 and that generated in the lower cover layer 55, a point of inflection (PI) may be formed at both end portions of the ceramic body 12 in the length direction, which are lower than the central portion of the ceramic body 12 in the thickness direction.

The PI is a point at which the phase of an outer surface of the ceramic body 12 is changed. The PI may be formed to be equal to or lower than a height of the solders 142 and 144 formed on the external electrodes 42 and 44 of the laminated chip capacitor 10 on the electrode pads 122 and 124.

Here, the central portion of the active layer 60 is a portion which is maximally expanded and contracted in both end portions of the ceramic body 12 in the length direction according to a voltage application.

Parasitic capacitance of the additional electrode layers 80 generated due to an influence of external electrodes 42 and 44 at both end portions of the ceramic body 12 in the length direction or the active layer 60 forming capacitance may accelerate a formation of the PI at both end portions of the ceramic body 12 in the length direction.

In FIG. 7, it can be seen that both end portions of the laminated chip capacitor 10 in the length direction are maximally expanded, and when both end portions of the laminated chip capacitor 10 in the length direction are maximally expanded, force ☐ thrusting upper portions of the solders 142 and 144 outwardly due to the expansion is generated, and contracting force ☐ thrusting the external electrodes is generated at the lower portions of the solders 142 and 144 by the force ☐ thrust to the outside.

Thus, a PI may be formed in a position lower than the height of the solders.

With reference to FIG. 5, a distance between both end portions of the first electrode pad 122 and the second electrode pad 124 is defined as L1 and a distance between the outer surfaces of the first external electrode 42 and the second external electrode 44 of the laminated chip capacitor 10 is defined as L2. Also, a distance between both end portions of the first electrode pad 122 and the second electrode pad 124 is defined as W1, and a distance between outer surfaces of the first external electrode 42 and the second external electrode 44 is defined as W2.

Figure 8A:
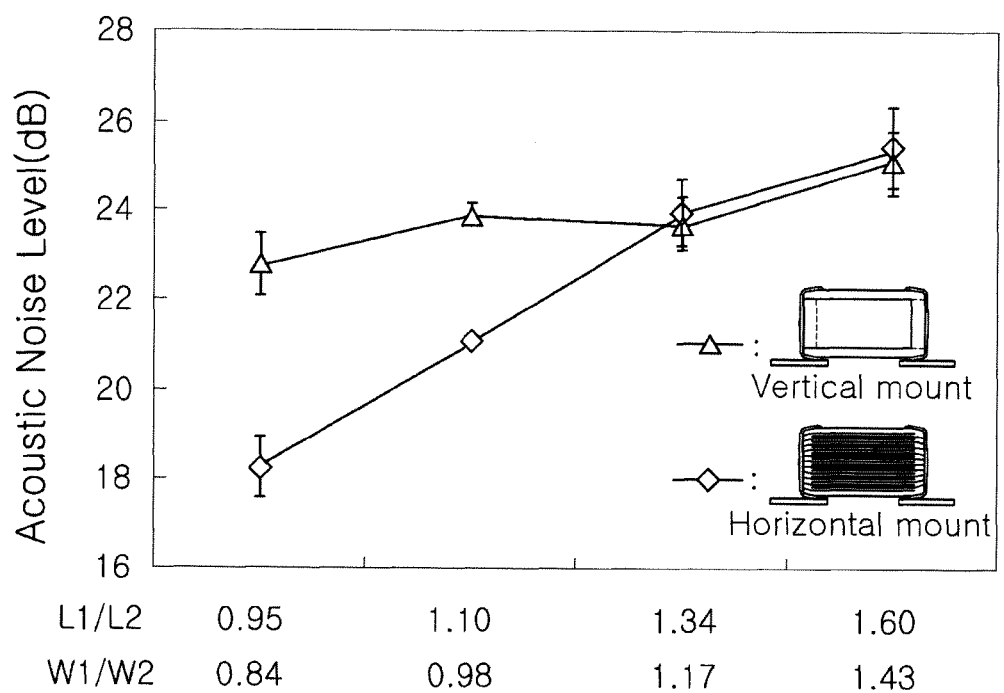
FIG. 8A is a graph showing a change in acoustic noise over electrode pad size when internal electrodes of a related art laminated chip capacitor are mounted to be vertical in relation to a PCB and mounted to be horizontal in relation to the PCB.

FIG. 8A is a graph showing a change in acoustic noise over electrode pad size when internal electrodes of a related art laminated chip capacitor are mounted vertically on a PCB and mounted horizontally on the PCB.

With reference to FIG. 8A, it can be seen that, when the size, i.e., L1/L2, of the electrode pad is reduced to be equal to or smaller than 1.34 and 1.17, in case of the laminated chip capacitor in which internal electrodes are mounted horizontally on the PCB, acoustic noise is reduced.

However, it can be seen that, in the case of the laminated chip capacitor in which internal electrodes are mounted vertically on the PCB, acoustic noise is not greatly reduced.

Namely, the size of the electrode pad has a different tendency in reducing acoustic noise according to whether the internal electrodes of the laminated chip capacitor are horizontally or vertically mounted on the PCB.

Figure 8B:
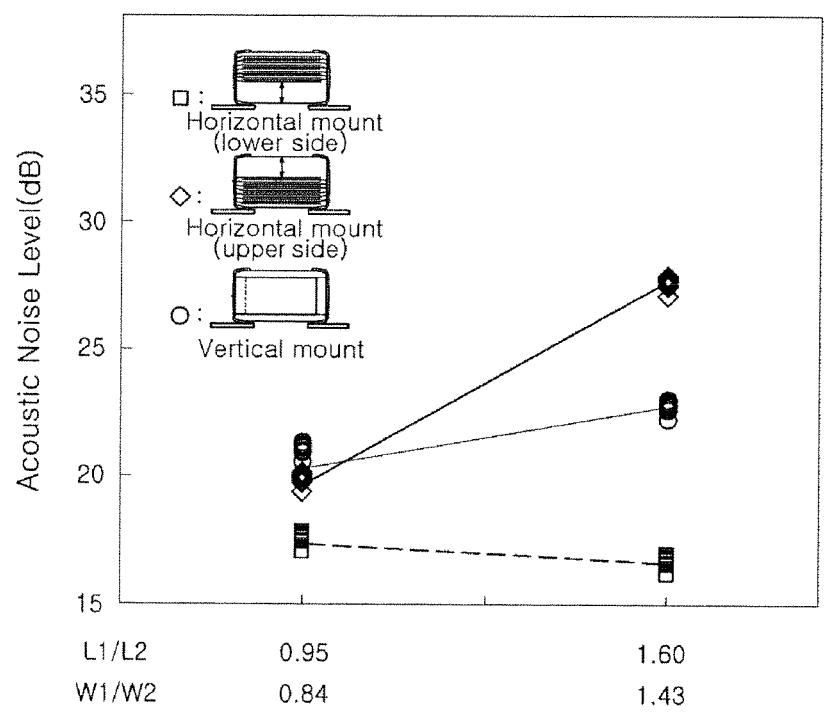
FIG. 8B is a graph showing a change in acoustic noise over electrode pad size when a laminated chip capacitor is mounted on a PCB such that internal electrodes are horizontal in relation to the PCB and a lower cover layer is adjacent to the PCB according to an embodiment of the present invention.

FIG. 8B is a graph showing a change in acoustic noise over electrode pad size when the laminated chip capacitor is mounted on a PCB such that internal electrodes are horizontal to the PCB and the lower cover layer is adjacent to the PCB according to an embodiment of the present invention.

With reference to FIG. 8B, it can be seen that the acoustic noise is different according to whether the thickness of the lower cover layer is thicker than that of the upper cover layer, even when the laminated chip capacitor is mounted on a PCB such that internal electrodes are horizontal to the PCB. Therefore, in order to further reduce the acoustic noise, it can be seen that another parameter is required.

According to example embodiments of the present invention, acoustic noise may be further reduced by controlling an extent of how much the central portion of the active layer is deviated from the central portion of the laminated chip capacitor, a ratio of the upper cover layer to the lower cover layer, a ratio of the lower cover layer to the thickness of the ceramic body, and a ratio of the lower cover layer to the thickness of the active layer, etc.

According to example embodiments of the present invention, it can be seen that the ratio ((B+C)/A) by which the central portion of the active layer 60 deviates from the central portion of the ceramic body 12 satisfies $1.063 \leq (B+C)/A \leq 1.745$, the acoustic noise may be sufficiently reduced even when the electrode pad is small so the amount of solder is small, and the acoustic noise may be further reduced rather when the electrode pad is large.

That is, when the ratio ((B+C)/A) by which the central portion of the active layer 60 deviates from the central portion of the ceramic body 12 satisfies the range $1.063 \leq (B+C)/A \leq 1.745$, acoustic noise can be significantly reduced irrespective of the size of the electrode pad. Herein, A, B and C represents a half of the thickness of the ceramic body, the thickness of the lower cover layer and a half of the thickness of the active layer, respectively.

This is understood to mean that, when the ratio ((B+C)/A) by which the central portion of the active layer 60 deviates from the central portion of the ceramic body 12 satisfies the range $1.063 \leq (B+C)/A \leq 1.745$, a maximum displacement of the laminated chip capacitor corresponds to an upper portion of the central portion of the ceramic body 12 based on the center of the active layer 60, and thus, displacement transferred to the PCB 120 through the solder is reduced to result in a reduction of the acoustic noise.

Packing Unit of Laminated Chip Capacitor

Figure 9:
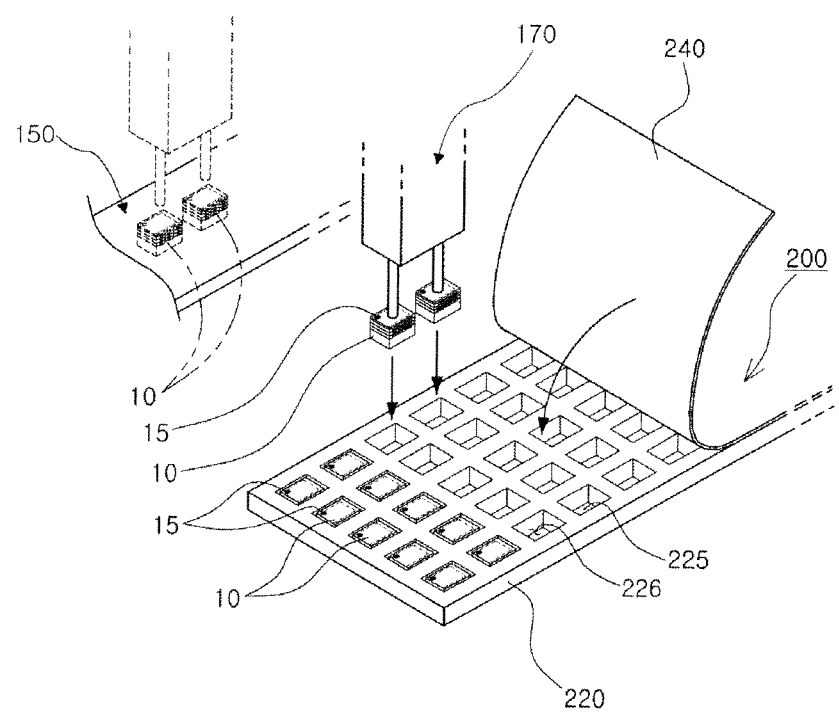
FIG. 9 is a schematic perspective view illustrating mounting of laminated chip capacitors in a packing unit according to an embodiment of the present invention.
Figure 10:
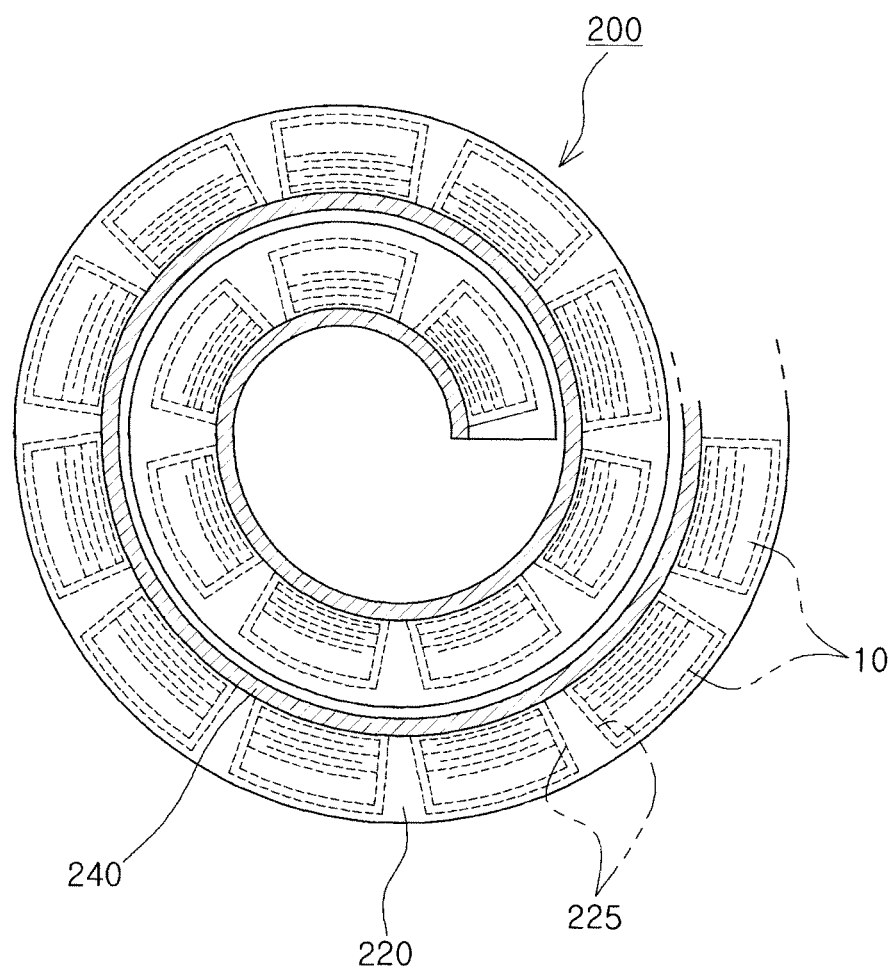
FIG. 10 is a schematic sectional view illustrating the packing unit of FIG. 9 wound in a reel shape.

FIG. 9 is a schematic perspective view illustrating mounting of laminated chip capacitors in a packing unit according to an embodiment of the present invention, and FIG. 10 is a schematic sectional view illustrating the packing unit of FIG. 9 wound in a reel shape.

With reference to FIG. 9, a packing unit 200 for packing a laminated chip capacitor according to the present embodiment may include a packing sheet 220 having a receiving portion 226 in which the laminated chip capacitor 10 is received.

The receiving portion 226 of the packing sheet 220 has a shape corresponding to an electronic component 10, and internal electrodes may be disposed horizontally based on a lower surface 225 of the receiving portion 226.

The laminated chip capacitor 10 is maintained in a state in which the internal electrodes thereof are aligned horizontally through an electronic component alignment device 150 and moved to the packing sheet 220 through a transfer device 170. Thus, the internal electrodes may be disposed to be horizontal based on the lower surface 225 of the receiving portion 226. In this manner, all the laminated chip capacitors 10 in the packing sheet 220 may be disposed to have the same directionality in the packing sheet 220.

Each of the laminated chip capacitors 10 received in the receiving portions 226 may be disposed such that the lower cover layer 55 faces the lower surface of the receiving portion 226. Also, a mark for differentiating upper and lower portions may be formed on an upper surface of the ceramic body 12.

The packing unit 200 for packing the laminated chip capacitor may further include a packing film 240 covering the packing sheet 220 in which the electronic component 10 is received such that the internal electrodes are disposed horizontally based on the lower surface 225 of the receiving portion 226.

FIG. 10 illustrates the packing unit 200 for packing the laminated chip capacitor, which is wound in a reel shape. The packing unit 200 may be continuously wound to be formed.

EXPERIMENTAL EXAMPLE

Multilayer ceramic capacitors (MLCC) according to embodiments of the present invention and comparative examples were fabricated as follows.

The MLCCs according to the Examples were manufactured through the following steps.

First, slurry including powder such as barium titanate (BaTiO$_3$), or the like, was applied to a carrier film and then dried to prepare a plurality of ceramic green sheets having a thickness of 1.8 μm.

Next, internal electrodes were formed by applying a conductive paste for a nickel internal electrode on the ceramic green sheets by using a screen.

About three hundreds and seventy (370) ceramic green sheets were laminated, and here, a larger number of ceramic green sheets without an internal electrode were laminated below ceramic green sheets with an internal electrode formed thereon than those above the ceramic green sheets with an internal electrode formed thereon. The laminate (or lamination body) was isostatic-pressed under a pressure condition of 1000 kgf/cm$^2$ at 85° C. The pressing-completed ceramic laminate was severed into individual chips, and a debinding process was performed by maintaining the severed chips at 230° C. for 60 hours under air atmosphere.

Thereafter, the chips were fired at an oxygen partial pressure of $10^{-11}$ atm $\sim 10^{-10}$ atm, lower than a Ni/NiO equilibrium oxygen partial pressure, under a reduced atmosphere such that the internal electrodes were not oxidized. After the firing operation, a chip size (length×width (L×W)) of a laminated chip capacitor was 1.64 mm×0.88 mm (L×W, 1608 size). Here, a fabrication tolerance was determined to be ±0.1 mm in length×width, and acoustic noise of a chip satisfying the fabrication tolerance was measured in the experimentation.

Thereafter, the chip was subjected to processes such as an external electrode formation process, a plating process, and the like, to fabricate an MLCC.

TABLE 1

| # | A (μm) | B (μm) | C (μm) | D (μm) | (B+C)/A | B/A | D/B | C/B | Acoustic Noise (dB) | obtainment of Cap. |
|---|---|---|---|---|---|---|---|---|---|---|
| 1* | 405.5 | 40.2 | 365.4 | 39.9 | 1.000 | 0.099 | 0.993 | 9.090 | 29.5 | OK |
| 2* | 436.0 | 70.4 | 365.9 | 69.7 | 1.001 | 0.161 | 0.990 | 5.197 | 25.7 | OK |
| 3* | 455.5 | 90.8 | 364.3 | 91.5 | 0.999 | 0.199 | 1.008 | 4.012 | 23.1 | OK |
| 4* | 508.1 | 24.9 | 361.1 | 269.1 | 0.760 | 0.049 | 10.807 | 14.502 | 31.2 | OK |
| 5* | 456.6 | 25.2 | 360.1 | 167.8 | 0.844 | 0.055 | 6.659 | 14.290 | 32.5 | OK |
| 6* | 527.3 | 30.2 | 191.0 | 642.4 | 0.419 | 0.057 | 21.272 | 6.325 | 30.3 | OK |
| 7* | 414.5 | 30.9 | 188.8 | 420.4 | 0.530 | 0.075 | 13.605 | 6.110 | 30.5 | OK |
| 8* | 516.2 | 39.4 | 360.7 | 271.5 | 0.775 | 0.076 | 6.891 | 9.155 | 28.2 | OK |
| 9* | 446.0 | 39.8 | 365.5 | 121.2 | 0.909 | 0.089 | 3.045 | 9.183 | 29.1 | OK |
| 10* | 469.1 | 40.6 | 364.2 | 169.1 | 0.863 | 0.087 | 4.165 | 8.970 | 27.9 | OK |
| 11* | 416.2 | 40.7 | 360.7 | 70.3 | 0.964 | 0.098 | 1.727 | 8.862 | 28.4 | OK |
| 12* | 428.3 | 40.8 | 360.0 | 95.7 | 0.936 | 0.095 | 2.346 | 8.824 | 28.9 | OK |
| 13* | 495.9 | 40.9 | 364.9 | 221.0 | 0.818 | 0.082 | 5.403 | 8.922 | 28.1 | OK |
| 14* | 435.9 | 25.0 | 421.3 | 4.2 | 1.024 | 0.057 | 0.168 | 16.852 | 31.6 | OK |
| 15* | 420.7 | 70.4 | 365.9 | 39.1 | 1.037 | 0.167 | 0.555 | 5.197 | 25.7 | OK |
| 16 | 431.7 | 94.8 | 364.3 | 40.0 | 1.063 | 0.220 | 0.422 | 3.843 | 19.9 | OK |
| 17 | 443.0 | 103.8 | 389.1 | 4.0 | 1.113 | 0.234 | 0.039 | 3.749 | 19.3 | OK |
| 18 | 443.7 | 119.8 | 363.2 | 41.1 | 1.089 | 0.270 | 0.343 | 3.032 | 18.7 | OK |
| 19 | 447.1 | 147.3 | 362.1 | 22.7 | 1.139 | 0.329 | 0.154 | 2.458 | 17.9 | OK |
| 20 | 452.8 | 164.7 | 360.2 | 20.4 | 1.159 | 0.364 | 0.124 | 2.187 | 17.3 | OK |
| 21 | 448.7 | 170.3 | 361.0 | 5.1 | 1.184 | 0.380 | 0.030 | 2.120 | 17.2 | OK |
| 22 | 470.7 | 170.4 | 365.4 | 40.2 | 1.138 | 0.362 | 0.236 | 2.144 | 17.4 | OK |
| 23 | 491.9 | 220.3 | 360.8 | 41.8 | 1.181 | 0.448 | 0.190 | 1.638 | 16.9 | OK |
| 24 | 500.6 | 270.2 | 360.5 | 9.9 | 1.260 | 0.540 | 0.037 | 1.334 | 16.8 | OK |
| 25 | 516.9 | 270.4 | 361.8 | 39.7 | 1.223 | 0.523 | 0.147 | 1.338 | 16.7 | OK |
| 26 | 502.1 | 364.9 | 312.3 | 14.7 | 1.349 | 0.727 | 0.040 | 0.856 | 16.6 | OK |
| 27 | 407.5 | 421.8 | 189.1 | 14.9 | 1.499 | 1.035 | 0.035 | 0.448 | 16.6 | OK |
| 28 | 445.8 | 493.3 | 179.3 | 39.7 | 1.509 | 1.107 | 0.080 | 0.363 | 16.5 | OK |
| 29 | 483.7 | 632.0 | 160.1 | 15.2 | 1.638 | 1.307 | 0.024 | 0.253 | 16.4 | OK |
| 30 | 520.0 | 643.4 | 190.7 | 15.2 | 1.604 | 1.237 | 0.024 | 0.296 | 16.4 | OK |
| 31 | 486.4 | 685.3 | 121.1 | 45.3 | 1.658 | 1.409 | 0.066 | 0.177 | 16.4 | OK |
| 32 | 507.2 | 742.7 | 120.8 | 30.1 | 1.702 | 1.464 | 0.041 | 0.163 | 16.4 | OK |
| 33 | 515.2 | 773.9 | 118.2 | 20.1 | 1.732 | 1.502 | 0.026 | 0.153 | 16.4 | OK |
| 34 | 524.5 | 798.2 | 116.9 | 16.9 | 1.745 | 1.522 | 0.021 | 0.146 | 16.3 | OK |
| 35* | 533.4 | 832.4 | 109.8 | 14.8 | 1.766 | 1.561 | 0.018 | 0.132 | 16.3 | NG |
| 36* | 533.3 | 841.1 | 105.3 | 14.9 | 1.775 | 1.577 | 0.018 | 0.125 | 16.3 | NG |
| 37* | 534.1 | 849.7 | 101.2 | 16.1 | 1.780 | 1.591 | 0.019 | 0.119 | 16.3 | NG |

* indicates comparative example

Data in Table 1 was obtained by measuring dimensions of sections of the central portion of the ceramic body 12 of the laminated chip capacitor 10 taken in the length direction (L) and the thickness direction (T) from the central portion of the ceramic body 12 in the width (W) direction, based on images taken by a scanning electron microscope (SEM).

Here, as described above, A was defined to be half of the overall thickness of the ceramic body, B was defined to be a thickness of the lower cover layer, C was defined to be half of the overall thickness of the active layer, and D was defined to be a thickness of the upper cover layer.

In order to measure acoustic noise, a single sample (laminated chip capacitor) per board for measuring acoustic noise was discriminated in a vertical direction and mounted on a PCB, and then, the board was mounted in a measurement jig. Thereafter, a DC voltage and varied voltages were applied to both terminals of the sample mounted in the measurement jig by using a power DC power supply and a signal generator (or a function generator). Acoustic noise was measured through a microphone installed directly above the PCB.

In Table 1, samples 1 to 3 were comparative examples having symmetrical cover structure which means that the thickness (B) of the lower cover layer is almost similar to the thickness (D) of the upper cover layer. Samples 4 to 13 were comparative examples having a structure that the thickness (D) of the upper cover layer is thicker than the thickness (B) of the lower cover layer. Samples 14, 15 and 35 to 37 were comparative examples having a structure that the thickness (B) of the lower cover layer is thicker than the thickness (D) of the upper cover layer. Samples 16 to 34 were embodiments of the present invention.

Embodiments of the present invention may have the upper cover layer 53 whose thickness (D) is the same to or thicker than 4 μm. If the thickness (D) of the upper cover layer is thinner than 4 μm, the internal electrode may be exposed from the upper surface $S_T$ of the ceramic body 12, resulting in a defective product.

The case that (B+C)/A is the same as or similar to 1 means that the central portion of the active layer is hardly deviated from the central portion of the ceramic body. (B+C)/A of the sample 1 to 3 having the symmetrical cover structure (that is, the thickness (B) of the lower cover layer is almost similar to the thickness (D) of the upper cover layer) is nearly 1.

The case that (B+C)/A is more than 1 may mean that the central portion of the active layer is deviated upward from the central portion of the ceramic body, and the case of (B+C)/A smaller than 1 may mean that the central portion of the active layer is deviated downward from the central portion of the ceramic body.

First, it can be seen that, samples 16 to 34, i.e., embodiments of the present invention, in which the ratio ((B+C)/A) by which the central portion of the active layer deviates from the central portion of the ceramic body satisfied 1.063≤(B+C)/A≤1.745, had drastically reduced acoustic noise less than 20 dB.

Samples 1 to 15, in which the ratio ((B+C)/A) by which the central portion of the active layer deviates from the central portion of the ceramic body was less than 1.063, had a structure that the central portion of the active layer is hardly deviated from the central portion of the ceramic body or deviated downward from the central portion of the ceramic body. It can be seen that samples 1 to 15 in which the ratio (B+C)/A was less than 1.063 did not have an acoustic noise reduction effect.

Samples 35 to 37, in which the ratio (B+C)/A was more than 1.745, had a lack of capacitance. That is, the capacitance of samples 35 to 37 is significantly lower than a target capacitance. In Table 1, "NG" of the "obtainment of Cap." (i.e., a rate of the capacitance of sample relative to a target capacitance means that the capacitance of sample is less than 80% of the target capacitance, when the target capacitance is 100%.

Also, it can be seen that embodiments in which a ratio (D/B) of the thickness (D) of the upper cover layer to the thickness (B) of the lower cover layer satisfied $0.021 \leq D/B \leq 0.422$ had considerably reduced acoustic noise.

Comparative examples in which the ratio (D/B) of the thickness (D) of the upper cover layer to the thickness (B) of the lower cover layer was more than 0.422, did not have an acoustic noise reduction effect. If the ratio D/B is less than 0.21, the thickness (B) of the lower cover layer is too thicker than the thickness (D) of the upper cover layer, such that crack or unacceptable delamination may occur, or lack of capacitance may occur.

It can be seen that samples 19 to 34, which are a portion of embodiments in which the ratio (B/A) of the thickness (B) of the lover cover layer to the half (A) of the thickness of the ceramic body satisfied $0.329 \leq B/A \leq 1.522$ or the ratio (C/B) of the half (C) of the thickness of the active layer to the thickness (B) of the lower cover layer satisfied $0.146 \leq C/B \leq 2.458$, had relatively further reduced acoustic noise less than 18 dB.

Samples 35 to 37, in which the ratio (B/A) of the thickness (B) of the lover cover layer to the half (A) of the thickness of the ceramic body was more than 1.522 or the ratio (C/B) of the half (C) of the thickness of the active layer to the thickness (B) of the lower cover layer was less than 0.146, had a lack of capacitance.

While the present invention has been shown and described in connection with the embodiments, it will be apparent to those skilled in the art that modifications and variations can be made without departing from the spirit and scope of the invention as defined by the appended claims.

What is claimed is:

1. A laminated chip electronic component capable of being mounted on a printed circuit board (PCB), the laminated chip electronic component comprising:
    a ceramic body including internal electrodes and dielectric layers;
    external electrodes formed to cover both end portions of the ceramic body in a length direction;
    an active layer in which the internal electrodes are disposed in an opposing manner, while having the dielectric layers interposed therebetween, to form capacitance; and
    upper and lower cover layers formed on upper and lower portions of the active layer in a thickness direction, the lower cover layer having a thickness greater than that of the upper cover layer and being adjacent to the printed circuit board;
    wherein when half of a thickness of the ceramic body is defined as A, a thickness of the lower cover layer is defined as B, half of a thickness of the active layer is defined as C, and a thickness of the upper cover layer is defined as D, the thickness (D) of the upper cover layer satisfies a range of D≥4 µm and a ratio (B+C)/A in which a central portion of the active layer deviates from a central portion of the ceramic body satisfies a range of $1.063 \leq (B+C)/A \leq 1.745$.

2. The laminated chip electronic component of claim 1, wherein a ratio (D/B) of the thickness (D) of the upper cover layer to the thickness (B) of the lower cover layer satisfies $0.021 \leq D/B \leq 0.422$.

3. The laminated chip electronic component of claim 1, wherein a ratio (B/A) of the thickness (B) of the lower cover layer to the half (A) of the thickness of the ceramic body satisfies $0.329 \leq B/A \leq 1.522$.

4. The laminated chip electronic component of claim 1, wherein a ratio (C/B) of the half (C) of the thickness of the active layer to the thickness (B) of the lower cover layer satisfies $0.146 \leq C/B \leq 2.458$.

5. The laminated chip electronic component of claim 1, wherein a mark for differentiating the upper and lower portions of the active layer is formed on at least one of upper and lower surfaces of the ceramic body.

6. A laminated chip electronic component capable of being mounted on a printed circuit board (PCB), the laminated chip electronic component comprising:
    external electrodes formed on both end portions of a ceramic body having a hexahedral shape in a length direction;
    an active layer formed within the ceramic body and including a plurality of internal electrodes disposed to face each other, while having dielectric layers interposed therebetween to form capacitance;
    an upper cover layer formed on an upper portion of the uppermost internal electrode of the active layer; and
    a lower cover layer formed on a lower portion of the lowermost internal electrode of the active layer and having a thickness greater than that of the upper cover layer and being adjacent to the printed circuit board,
    wherein due to a difference between strain generated in a central portion of the active layer and that generated in the lower cover layer as a voltage is applied, a point of inflection (PI) is formed at both end portions of the ceramic body in the length direction, which is lower than the central portion of the ceramic body in the thickness direction, and
    when half of a thickness of the ceramic body is defined as A, a thickness of the lower cover layer is defined as B, and half of a thickness of the active layer is defined as C, a ratio (B+C)/A by which a central portion of the active layer deviates from a central portion of the ceramic body satisfies a range of $1.063 \leq (B+C)/A \leq 1.745$.

7. The laminated chip electronic component of claim 6, wherein when a thickness of the upper cover layer is defined as D, a ratio (D/B) of the thickness (D) of the upper cover layer to the thickness (B) of the lower cover layer satisfies $0.021 \leq D/B \leq 0.422$.

8. The laminated chip electronic component of claim 6, wherein a ratio (B/A) of the thickness (B) of the lower cover layer to the half (A) of the thickness of the ceramic body satisfies $0.329 \leq B/A \leq 1.522$.

9. The laminated chip electronic component of claim 6, wherein a ratio (C/B) of the half (C) of the thickness of the active layer to the thickness (B) of the lower cover layer satisfies $0.146 \leq C/B \leq 2.458$.

10. A board for mounting a laminated chip electronic component, the board comprising:
    the laminated chip electronic component of claim 1;
    electrode pads electrically connected to the external electrodes through soldering; and the printed circuit board (PCB) on which the electrode pads are formed and the laminated chip electronic component is mounted on the electrode pads such that the internal electrodes are horizontal and the lower cover layer is disposed at a lower side than the upper cover layer in a thickness direction.

11. The board of claim 10, wherein due to a difference between strain generated in a central portion of the active layer and that generated in the lower cover layer as a voltage is applied, a point of inflection (PI) formed at both end portions of the ceramic body in a length direction is formed to be lower than the height of the soldering.

12. A packing unit, comprising:
a laminated chip electronic component; and
a packing sheet including a receiving portion for receiving the laminated chip electronic component,
the laminated chip electronic component comprising:
a ceramic body including internal electrodes and dielectric layers;
external electrodes formed to cover both end portions of the ceramic body in a length direction;
an active layer in which the internal electrodes are disposed in an opposing manner, while having the dielectric layers interposed therebetween, to form capacitance; and
upper and lower cover layers formed on upper and lower portions of the active layer in a thickness direction, the lower cover layer having a thickness greater than that of the upper cover layer, the lower cover layer being adjacent to the receiving portion of the packing sheet;
wherein when a half of a thickness of the ceramic body is defined as A, a thickness of the lower cover layer is defined as B, half of a thickness of the active layer is defined as C, and a thickness of the upper cover layer is defined as D, the thickness (D) of the upper cover layer satisfies a range of D≥4 μm and a ratio (B+C)/A in which a central portion of the active layer deviates from a central portion of the ceramic body satisfies a range of $1.063 \leq (B+C)/A \leq 1.745$,
wherein the internal electrodes are disposed to be aligned horizontally based on a lower surface of the receiving portion,
wherein the lower cover layer of the laminated chip electronic component faces the
lower surface of the receiving portion.

13. The packing unit of claim 12, further comprising:
a packing film coupled to the packing sheet and covering the laminated chip electronic component.

14. The packing unit of claim 12, wherein the packing sheet in which the laminated chip electronic component is received is wound as a reel type.

15. The packing unit of claim 12, wherein the laminated chip electronic component received in the receiving portion has directionality such that the lower cover layer faces the lower surface of the receiving portion, and a mark is formed on the ceramic body in order to allow the directionality in which the lower cover layer faces the lower surface of the receiving portion, to be recognized from the outside.

16. The packing unit of claim 12, wherein a mark for differentiating upper and lower portions is formed on an upper surface of the ceramic body.

17. A board for mounting a laminated chip electronic component, the board comprising:
the laminated chip electronic component of claim 6;
electrode pads electrically connected to the external electrodes through soldering; and
the printed circuit board (PCB) on which the electrode pads are formed and the laminated chip electronic component is mounted on the electrode pads such that the internal electrodes are horizontal and the lower cover layer is disposed at a lower side than the upper cover layer in a thickness direction.

* * * * *